United States Patent [19]
Reed et al.

[11] Patent Number: 5,165,065
[45] Date of Patent: * Nov. 17, 1992

[54] OPTICALLY PUMPED QUANTUM COUPLED DEVICES

[75] Inventors: Mark A. Reed, Dallas; Gary A. Frazier, Garland, both of Tex.

[73] Assignee: Texas Instruments Incorporated, Dallas, Tex.

[ * ] Notice: The portion of the term of this patent subsequent to Oct. 31, 2006 has been disclaimed.

[21] Appl. No.: 655,244

[22] Filed: Feb. 13, 1991

Related U.S. Application Data

[63] Continuation of Ser. No. 422,823, Oct. 17, 1989, abandoned, which is a continuation of Ser. No. 725,030, Apr. 19, 1985, Pat. No. 4,878,104.

[51] Int. Cl.⁵ .................. H01L 27/14; H01L 45/00; H01L 29/205; H01L 29/78
[52] U.S. Cl. .................. 307/311; 257/184; 257/185; 257/191
[58] Field of Search .................. 357/4, 16, 24, 30

[56] References Cited

U.S. PATENT DOCUMENTS 4,450,463  5/1984  Chin .................. 357/30
4,503,447  3/1985  Iafrate et al. .................. 357/30
4,878,104  10/1989  Reed et al. .................. 357/30

Primary Examiner—Gene M. Munson
Attorney, Agent, or Firm—Ira S. Matsil; B. Pater Barndt; Richard L. Donaldson

[57] ABSTRACT

Optically pumped coupled quantum well devices are disclosed. The devices store bits as carrier packets in depressions in the conduction and/or valence band(s) of a single crystal; the band between the depressions is sloped in a common direction which provides unidirectionality. The carrier packets are shifted from depression to depression by optically exciting the carriers and relying on the arrangement of depressions and band slopes; the excitation is conveniently performed by laser illumination. The depressions may be sufficiently small to discretize the energy levels and thereby permit the partitioning of the depressions into groups with each group having depressions of substantially the same energy level structure. The carriers in depressions of one group can then be selectively excited by illumination with a laser or narrow band monochromatic incoherent light source tuned to the energy level structure; this allows multiphase operation of the shifting function.

4 Claims, 8 Drawing Sheets

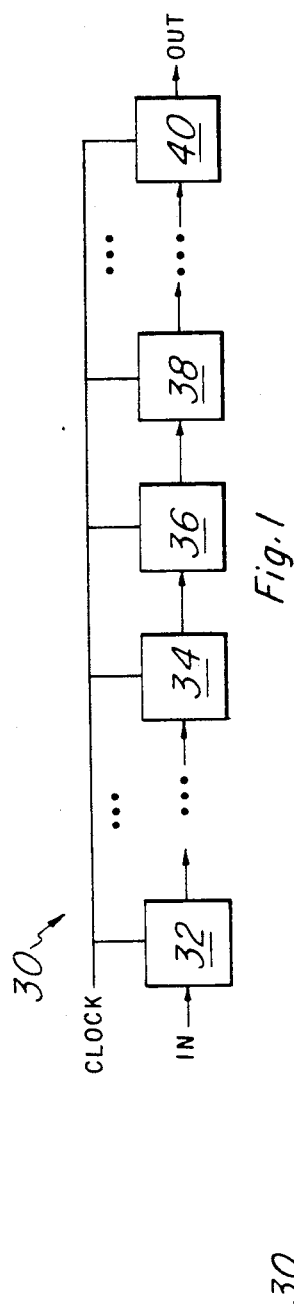
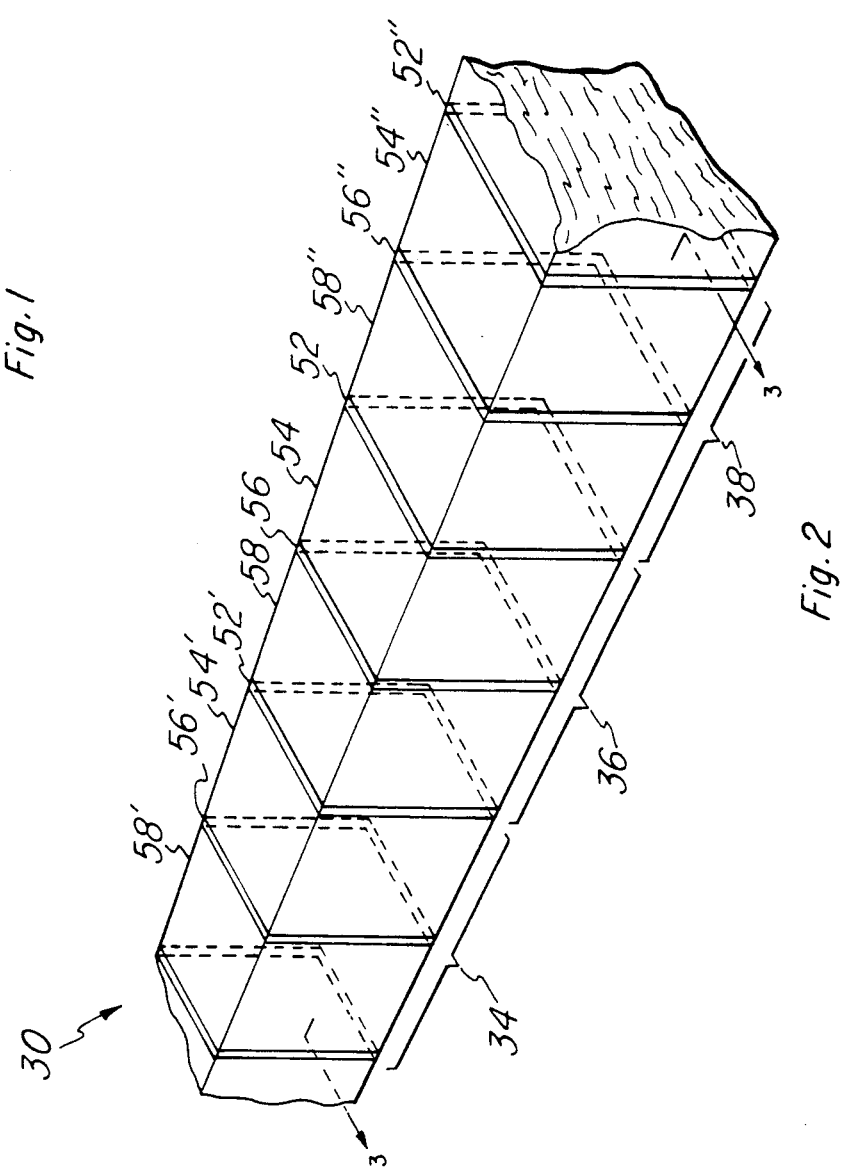

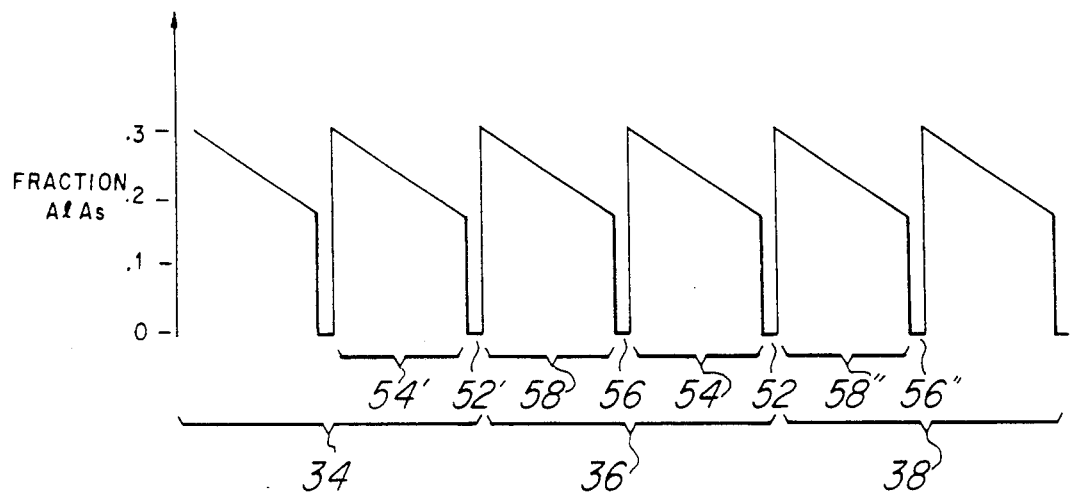
Fig. 3
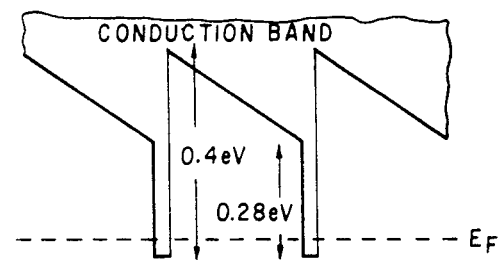
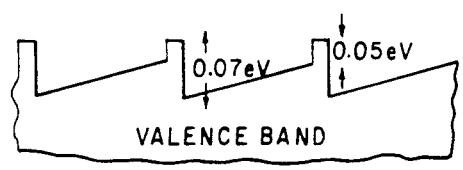
Fig. 4

OPTICALLY PUMPED QUANTUM COUPLED DEVICES

This application is a continuation of application Ser. No. 07/422,823 filed Oct. 17, 1989 now abandoned which is a continuation of application Ser. No. 06/725,030 filed Apr. 19, 1985 now U.S. Pat. No. 4,878,104 issued Oct. 31, 1989.

BACKGROUND

The present invention relates to electronic semiconductor devices, and, more particularly, to quantum well devices pumped (clocked or activated) by optical excitation.

Quantum well devices are known in various forms, heterostructure lasers being a good example. Quantum well heterostructure lasers rely on the discrete energy levels in the quantum wells to achieve high efficiency and typically consist of a few coupled quantum wells; see, generally, Sze, Physics of Semiconductor Devices, 729-730 (Wiley Interscience, 2d Ed 1981). High Electron Mobility Transistors (HEMTs) are another type of quantum well device and typically use only one half of a quantum well (a single heterojunction) but may include a stack of a few quantum wells. The HEMT properties arise from conduction parallel to the heterojunctions and in the quantum well conduction o valence subbands; the conduction carriers (electrons or holes) are isolated from their donors or acceptors and this isolation limits impurity scattering of the carriers. See, for example, T. Drummond et al, Electron Mobility in Single and Multiple Period Modulation-Doped (Al,-Ga)As/GaAs Heterostructures, 53 J.Appl.Phys.1023 (1982). Superlattices consist of many quantum wells so tightly coupled that the individual wells are not distinguishable, but rather the wells become analogous to atoms in a lattice. Consequently, superlattices behave more like new types of materials than as groups of coupled quantum wells; see, generally, L. Esaki et al, Superfine Structure of Semiconductors Grown by Molecular-Beam Epitaxy, CRC Critical Reviws in Solid State Sciences 195 (April, 1976).

Conventional quantum wells are typically in the order of 100 A thick and can easily be fabricated to occupy an area of a few square microns and thus provide extremely small devices with consequent high packing densities and small propagation delays. Fully quantized structures can be as small as 100 A on a side. However, known quantum well devices are unable to perform the functions of standard electronic components such as flip flops, shift registers, multiplexers, operational amplifiers, random access memories, etc.

Shift registers are standard electronic components with applications in digital computer systems, data-handling systems, serial memory, and control systems and are available in various device technologies such as transistor-transistor logic (TTL), emitter-coupled logic (ECL), and charge coupled devices (CCDs). For example, commercially available serial-in serial-out TTL shift registers include the SN54LS91 (8-bit) and the SN5494 (4-bit). Such TTL devices typically consist of bipolar transistors with dimensions of each transistor of the order of a few microns in all three directions and support shift rates of the order of hundreds of megahertz (propagation delays in the order of nanoseconds). In contrast to TTL devices which rely on switching currents, CCDs shift electron packets by inducing and collapsing adjacent potential wells in a semiconductor substrate. This inducing and collapsing is controlled by applying voltages to electrodes over the semiconductor substrate. CCDs typically have dimensions of a few microns square by a micron deep for each potential well, and the wells are located side by side near the surface of the substrate. CCDs have maximum shift rates on the order of hundreds of megahertz.

However, it is a problem in the known shift registers to decrease size and increase shift rate.

SUMMARY OF THE INVENTION

The present invention provides charge transfer devices in which the cells are quantum wells and the shifting of charge (clocked or continuous) is driven by optical excitation. Some preferred embodiments use two or more frequencies of optical excitation to induce charge transfer by partitioning the quantum wells into groups so that the wells within a group have energy levels that are not responsive to one or more of the optical excitation frequencies. Also, preferred embodiments increase charge transfer efficiency by use of compositional grading between the wells, or by use of a pulse width modulated superlattice emulating such a compositional grading, to enhance the transition probabilities in the transfer direction relative to the reverse direction. Further preferred embodiments rely solely on compositional grading to form the wells (triangular) and only employ a single frequency of optical excitation with pauses between pulses of excitation permitting preservation of charge packets in the triangular wells. Other preferred embodiments rely on continuous excitation and a continuous stream of charge transfer. The preferred embodiments and variations may be used to construct shift registers, charge pumps, photodiodes, and sundry other devices. These quantum well devices are inherently small, especially the devices with the requirement of discrete energy levels in the wells. The clocking speed (shifting rate) is essentially limited only by the optical excitation source power and its switching speed.

Thus the problems of large size and low shift rates are solved.

BRIEF DESCRIPTION OF THE DRAWINGS

FIG. 1 is a schematic equivalent circuit of a first preferred embodiment shift register;

FIG. 2 is a schematic perspective view of the first preferred embodiment register;

FIG. 3 is a composition profile along line 3—3 of FIG. 2;

FIG. 4 illustrates the conduction and valence bands along line 3—3 of FIG. 2;

DESCRIPTION OF THE PREFERRED EMBODIMENTS

Figure 5:
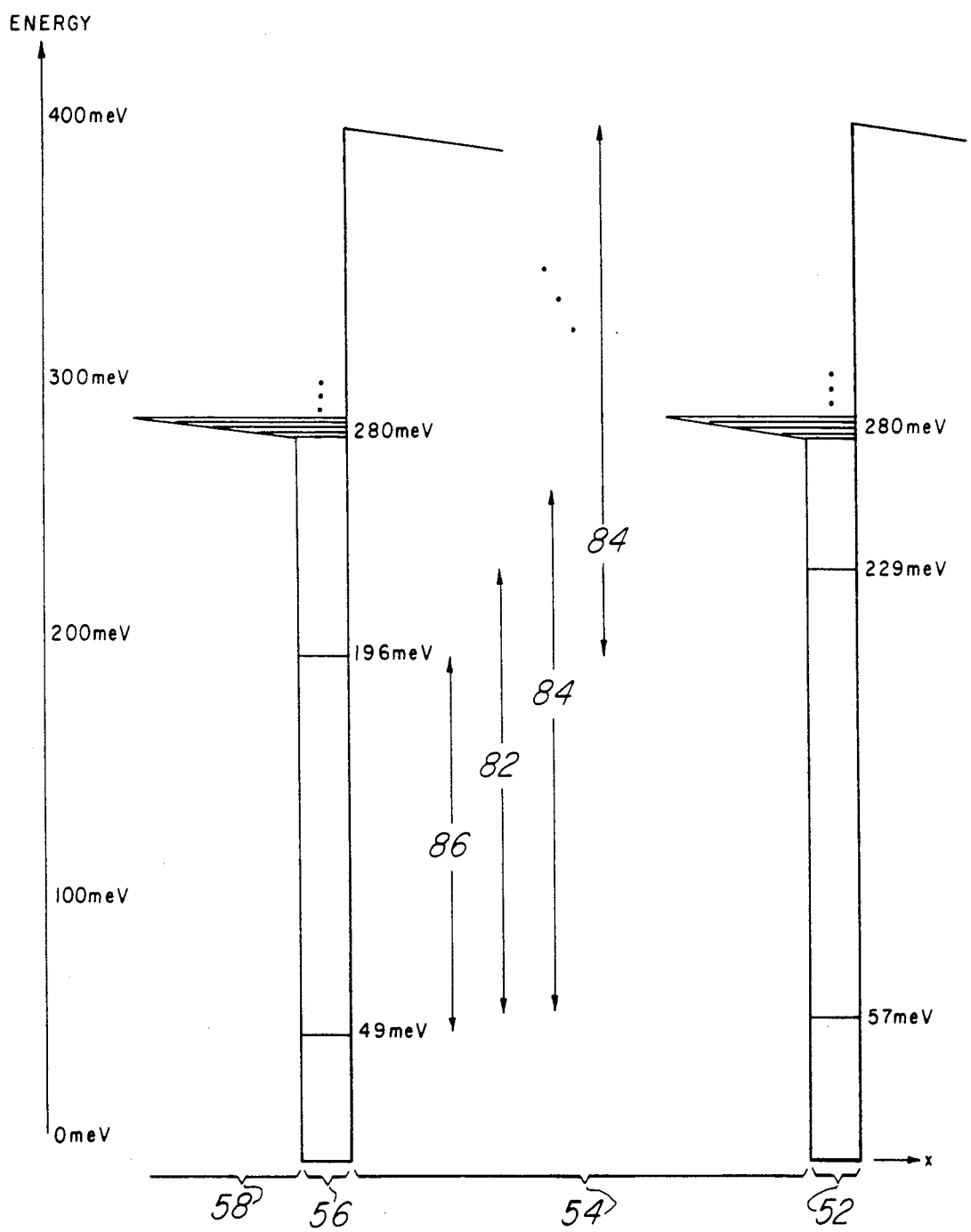
FIG. 5 illustrate the energy levels in two of the potential wells of FIG. 4.

A first preferred embodiment serial in/serial out shift register, generally denoted 30, is illustrated in schematic equivalent circuit view in FIG. 1 and includes the usual building blocks: a series of cells 32, 34, 36, 38, and 40, unidirectional connections between adjacent cells, a global clocking activation of the cells, and input and output terminals for the series of cells. Each cell can store a bit of information; and the clocking moves (shifts) the bits of information from cells to adjacent cells in the direction of the connections between the cells. (Analogously, note that in a three phase charge coupled device shift register each cell includes three clocked electrodes/gates and three corresponding potential wells with a bit of information represented as electric charge stored in one of the wells; the clocking to move the stored electric charge from one cell to the adjacent cell is a sequence of three electric pulses to the three gates. This three phase structure provides the directionality of the movement of the stored charge.) The clocking in register 30 is accomplished by lasers activating electrons in quantum wells, as will be described below.

FIG. 2 is a perspective view of adjacent cells 34, 36, and 38 of register 30; the other cells of register 30 are similar to these cells and the operation of register 30 can be understood be consideration of the movement of bits of information through these three cells. Note that insulation and packaging has been omitted and the horizontal scale greatly exaggerated for clarity in FIG. 2. Cell 36 includes layer 52 of undoped GaAs, layer 54 of graded AlxGa1-xAs lightly doped n type, layer 56 of undoped GaAs, and layer 58 of graded AlxGa1-xAs lightly doped n type. Cells 34 and 38 replicate cell 36 and have corresponding layers with corresponding reference numerals with primes and double primes, respectively, to distinguish them from cell 36's. Layers 52, 54, 56, and 58 all have a common square cross section of about 10 microns by 10 microns but with thicknesses as follows: layer 56 is about 67 A, layer 52 is about 62 A, layers 54 and 58 are both about 3,000 A. The composition of layer 54 varies linearly with distance along 3—3 from A1.29Ga.71As at the interface with layer 56 to A1.2Ga.8As at the interface at layer 52; the composition of layer 58 is similarly graded and oriented. Layers 52, 54, 56, and 58 of cell 36 together with the layers of the other cells of register 30 form a single crystal and may be fabricated by standard molecular beam epitaxy techniques. Clearly, the direction of epitaxial growth is along line 3—3.

FIG. 3 is a composition profile along line 3—3 of FIG. 2 and shows the fraction of AlAs as a function of position. FIG. 4 is an energy level diagram showing the lowest conduction and the valence bands and Fermi level along the same line 3—3 as in FIG. 3. Since the as-grown material is usually unintentionally doped n-type and the contacts can be made n-type, the storage in and transfer of information between cells is predominantly by electrons. Consequently, discussion of holes and the valence band will be omitted in the following description, although a device that operates on the same principles with holes is equally valid. As indicated in FIG. 4, the conduction band discontinuity at the interface of layers 52 and 54 is about 0.28 eV (280 meV) and the discontinuity at the interface of layers 54 and 56 is about 0.40 eV (400 meV). Note that these numbers are derived by using the generally accepted partition of the gap difference between GaAs and AlGaAs into 85% appearing as a conduction band discontinuity and 15% as a valence band discontinuity. This partitioning is suspect, and a partitioning as 60% conduction band discontinuity and 40% valence band discontinuity has supporters. As will be apparent from the following discussion, the partition has no particular effect on the operation of register 30 beyond adjusting the numbers.

The operation of register 30 depends on transitions of electrons between levels in the conduction band, and thus some approximate quantitative analysis will be used as an explanation aid. However, the approximations used and the analysis performed should not be construed to be part of the register 30. In particular, we shall use an approximation for an electron in the conduction band which models the potential acting on the electron as equal the conduction band edge and ignores (initially) any other electrons in the same or other subbands in wells in the conduction band. Further, the electron wave function will be presumed to be the product of a lattice periodic function (Bloch function) and an envelope function; the Bloch function in the AlGaAs layers will be taken to be of the same form as in the GaAs. For definiteness, the spatial coordinate system is chosen with x the variable along the direction of line 3—3 and y,z the variables parallel to the interfaces between the layers 52, 54, 56, 58, etc.

The first calculation finds the energy eigenvalues for an electron in the potential wells formed by layers 52 and 56; these are wells in the x direction only, and thus the discrete energy levels calculated for y and z wave vectors equal zero will in fact be the bottoms of subbands with almost a continuum of levels corresponding to increasing y and z wave vectors due the large y and z dimensions. The effective mass approximation at the bottom edge of a subband presumes parabolic subbands (energy is a parabolic function of wavevector) and that the kinetic energy of an electron with wave vector (kx,ky,kz) is (hkx)2/2m+[(hky)2+(hkz)**2]/2M where m is the effective mass in the x direction and M the effective mass in the y-z directions (by symmetry the y and z directions have the same effective mass unless the crystal orientation precludes this). For calculations, taking M and m equal to 0.067 times the rest mass of an electron amounts to using the bulk GaAs effective mass.

Now, consider the wavefunction of an electron in the lowest energy subband in well 56. We can approximate the wavefunction as follows:

$$|1\rangle = \begin{cases} Au(.)\exp i(yky + zkz)\exp xk1 & \text{for } x < 0 \\ Bu(.)\exp i(yky + zkz)\sin(xk2 + c) & 0 < x < 67\,A \\ Cu(.)\exp i(yky + zkz)\exp -xk3 & 67\,A < x \end{cases}$$

where A,B,C,c and k1,k2,k3 are determined by matching boundary conditions, u(.) is the Bloch function, ky and kz are the wave vectors in the y and z directions, and k1, k2, and k3 are the x wave vectors in the three layers 58, 56, and 54; note that the origin for the x coordinate has been taken to be at the interface of layers 58 and 56 for convenience, and that k1, k2, k3 will be the lowest of a discrete set of possible solutions for each ky, kz pair. Also note that the graded potentials from layers 58 and 54 have been approximated by constant potentials equal to the value of the potentials at the interfaces; and that the electron spin has been suppressed. Further observe that if the lowest subband in well 56 were filled with electrons to a density of 1E10/cm2, then the discrete energy levels are essentially shifted up by about 1 meV due to the electrostatic potential created by the electrons, but the relative spacing of the energy levels has only a negligible change.

The ground state energy for well 52 lies at approximately 57 meV above the conduction band edge (that is, the lowest subband bottom edge is 57 meV above the band edge), with the first excited state lying at 229 meV (these low levels were calculated by approximating well 52 with an infinitely high barrier square potential). Above this, the next state lies at approximately 280 meV, with closely spaced states (at about 2 meV) extending above, due to the triangular portion 54 of the potential. For well 56 with the same approximations, the ground state is at approximately 49 meV above the conduction band edge, the first excited state is at 196 meV, and then the same continuum starting at 280 meV. Note that the grading and thickness of layers 54 and 58 imply that the discrete energy levels rapidly cluster and essentially form a continuum from the bottom of the triangular portion of the potential to the top of the barriers forming the wells. This implies that spatially localized states of electrons exist which are almost unbound from well 56 and that interband phonon transitions are allowed and fast between such states. In contrast, phonon transitions of electrons among the lowest two discrete energy levels are negligible at 300K (recall that kT at 300K is about 26 meV). Following W. P. Dumke, 132 Phys. Rev. 1998 (1963), we arrive at the capture cross sections for the two processes;

i) For photon emission to drop to the lowest energy level, $$s(pt)(cm2) = (2E\text{-}18)(epsilon^{**}.5)(m/m^*)^{**}2)(E/T)$$

ii) For phonon emission, $$s(pn)(cm2) = 256pi(E^{}2)(h^{}5)(vl^{**}3)/rho((aB^*)^{}6)(E^{}5)kT$$

where epsilon is the dielectric constant, m* the effective mass, E the transition energy, T the temperature, vl the longitudinal sound velocity, rho the density, and aB* the effective Bohr radius. For this case, (at 4K) we get $s(pt) \sim 1.5E-17/cm2$ and $s(pn) \sim 2E-19/cm2$; thus the photon branch is predominantly allowed.

Figure 6:
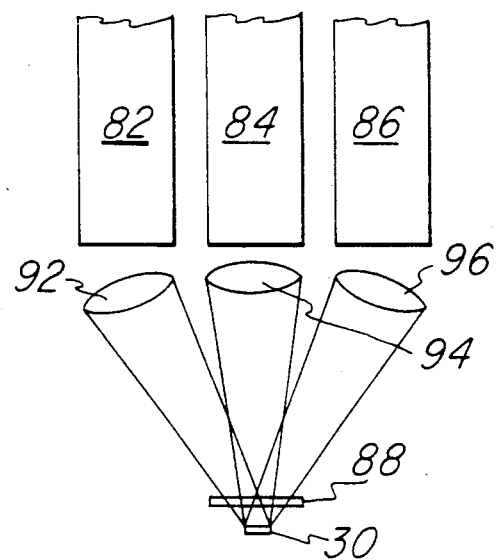
FIG. 6 is a schematic perspective view of the clocking lasers activating the stored charge in the potential wells of the first preferred embodiment register.

FIG. 6 schematically illustrates lasers 82, 84, and 86 arranged for optical excitation and movement of electrons from cell to cell; that is, clocking of register 30. The wavelength of laser 82 is 7.2 microns; this corresponds to the energy difference between the ground and the first excited discrete level in well 52. The wavelength of laser 86 is 8.4 microns; this corresponds to the energy difference between the ground and the first excited discrete level in well 56. And the wavelength of laser 84 is 6.1 microns; this corresponds to a photon energy of 204 meV which is greater than the difference of the ground and the first excited discrete levels in wells 52 and 56, but is less than the difference of the ground and the second excited discrete levels in wells 52 and 56, and further, is at least as great as the difference between the first excited discrete levels and the top of the barriers for both wells 52 and 56. FIG. 5 illustrates the energies of photons from lasers 82, 84, and 86 relative to the discrete levels in wells 52 and 56. The outputs of lasers 82, 84, and 86 are focussed on the cells 32, 34, 36, 38, 40, etc. by optical systems 92, 94, and 96 and polarized if necessary by polarizer 88 so that the electric field is parallel to the y direction to increase the absorption of electrons in the wells for a given light intensity impinging on register 30. Note that register 30 could also be illuminated end on if it were sufficiently short (low number of cells) so that absorption by the end cells did not greatly diminish the light intensity at the interior cells.

The clocking of register 30 can now be described. First consider cell 36 with its stored bit of information represented as a packet of electrons (packet size in the order of 1E7 electrons) in the lowest subband of well 56 for a "1" and an absence of (perhaps less than 1E4) electrons in the lowest subband for a "0"; well 52 has an absence of electrons (again, perhaps less than 1E4 electrons) in its lowest subband. This stored charge is roughly comparable in magnitude to the stored charge in a cell of a CCD. The clocking of register 30 is performed by alternately activating lasers 82 and 84 and lasers 84 and 86 in 7 psec pulses with a pause of 8 psec between pulses. One cycle of activation (first a pulse of lasers 84 and 86 followed by a pulse of lasers 82 and 84) moves the stored electrons (if any) out of well 56 into well 52 and then out of well 52 into well 56" (that is, out of cell 36 and into cell 38); simultaneously the electrons stored in the other cells are also being moved to the adjacent cells. In more detail, first consider the case of the stored charge ("1" or "0") being in wells 56, 56', 56", etc. and no charge in wells 52, 52', 52", etc. and the 7 psec of activation of lasers 82 and 84. The transition probability matrix element for an electron in the lowest subband of well 56 being excited into a higher energy state by absorption of a photon from either laser 82 or laser 84 is given by $$<i|De.p[expi(s.r)]|f>$$

where D is a constant equal to $(q/m)(Ih/2permwc)^{\frac{1}{2}}$, q is the electron charge, m the electron effective mass, I the photon flux from the laser under consideration, h Planck's constant divided by 2 pi, perm is the permittivity of GaAs, w the angular frequency of the laser, c the speed of light, e is the polarization vector of the photon, p is the momentum operator for the electron, s is the photon wave vector, r is the position of the electron, and $|i>$ is the initial state and $|f>$ the final state. Of course, this matrix element is just the usual arising from an interaction Hamilitonian for an electron with an electromagnetic field of the form p.A with A being the vector potential. Also, the transition rate is proportional to the absolute square of the matrix element multiplied by a delta function of the energy of $|f>$ minus the energy of $|i>$ plus the photon energy. Thus, the transition rate for electrons from the ground subband to excited subbands of well 56 is zero simply because of the conservation of energy, which is imposed by the delta function; see FIG. 5 for illustration of the fact that only laser 86 can excite an electron from the ground level in well 56 and recall that the polarization of the photons prohibits absorption in an intrasubband transition by the electron (i.e., an increase in the y or z momentum only).

Note that any electrons in well 52 will be excited from the ground level to the first excited level and further levels due to laser 82, but well 52 only has an insignificant number of electrons.

Conversely, during the 7 psec of activation of laser 86, electrons at the bottom of the lowest subband in well 56 are excited to the bottom of the first excited subband by absorption of a photon. (Similarly, electrons with a small energy E above the bottom of the lowest subband will be excited to states with an energy E above the bottom of the first excited subband.) These excited electrons in the first excited subband then may do one of three things: (1) emit a photon and fall back to the lowest subband; (2) absorb a photon from laser 84 and make a transition to a localized state in the quasi continuum at the top of well 57; or (3) absorb another photon from laser 82 and make a transition to a localized state in the quasicontinuum somewhat below the top of well 56. See FIG. 7A for a heuristic illustration.

The relative rates (time constants) of these three transitions depend upon the populations in the states and the intensity of the lasers, and may be approximated as follows:

(1) Spontaneous emission of a photon is calculated by considering the transition rate between initial and final states in the dipole approximation. Using the states of Coon et al, 45 Appl.Phys.Lett. 649 (1984) yields a relaxation time in the order of a nanosecond, which agrees with experiment (see t'Hooft et al, Int. Conf. Superlattices, Urbana, Ill. 1984), and is so slow that transition (1) may be ignored. Note that the device could lase now if there did not exist a loss mechanism from the excited level because the population is inverted.

(2) The transition rate to an excited level at the top of the barrier for a 500 microwatt/micron2 laser 84 will be about 2 psec, which is much less than the relaxation process of transition (1).

(3) The transition to an excited level by absorption of a photon from laser 86 is again about 2 psec. Note that making laser 84 much more intense than laser 86 will lead to the branching ratio between transitions (2) and (3) becoming very large and transition (3) could also be ignored; this will be a reasonable approximation even if the branching ratio were 5 to 1 as will become apparent after the branching subsequent to transition (2) is discussed below. Consequently, we shall presume that the power of laser 84 is increased so that transition (2) takes about 0.2 psec while transition (3) remains at 2 psec.

Figure 7B:
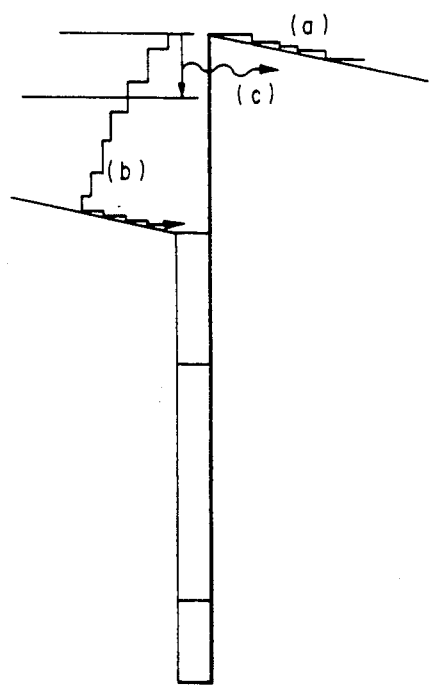
FIG. 7A-B illustrates electron transitions during clocking of the first preferred embodiment register.
Figure 7A:
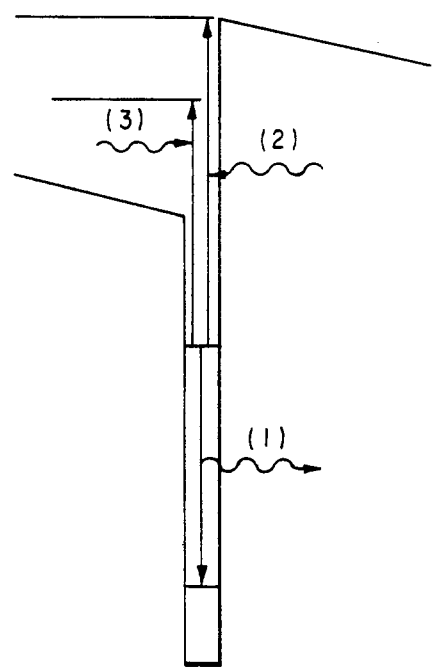

Electrons that make transition (2) may then either (a) pass into region 54 and drift towards well 52, (b) drift into region 58, or (c) photonically or phononically relax while remaining in well 56; see FIG. 7B for heuristic illustration. Now, examining the cases one at a time:

(a) An electron excited to 400 meV above the bottom of well 56 will have an intial $\times$ velocity in the order of 1E8 cm/sec [10,000 A/psec] if one uses the effective mass equal 0.067 times the electron rest mass. With this initial velocity an unscattered electron would drift out of well 56 in 0.01 psec; however, scattering may be expected to slow down the electron. But the 400 meV initial energy is somewhat close to the collision free window, and estimates on the probability of being scattered in such a short interval (see, J. Tang et al, 29 IEEE Tran.Elec.Dev. 1906 (1982)) indicate that we can approximate the time that the electron spends in well 56 as negligible. Thus, if the initial velocity of the electron is in the positive $\times$ direction, the electron will pass (or tunnel through if it has lost a little energy in a scattering event) the barrier to enter region 54; note that once in region 54 the electron relaxes to the conduction band edge and drifts towards well 52 as heuristically illustrated in FIG. 7B.

(b) For an excited electron with its initial velocity in the negative $\times$ direction drift in region 58 quickly reverses and becomes motion in the positive $\times$ direction as the phonon relaxation time to the band edge is very fast and has been measured (see K. Seeger, Semiconductor Physics. pg.222) to be less than 0.5 psec. Further, the slope of the conduction band in region 58 indicates a quasi field of 4,000 V/cm which will likely aid this relaxation. Thus all carriers starting with $\times$ velocity toward 52' will quickly end up in approximately the 280 meV level in well 56; see FIG. 7B for a heuristic illustration. For the purpose of illustration we shall presume that this relaxation to approximately the 280 meV level takes 0.3 psec. Of course, electrons in the 280 meV level in well 56 will absorb photons from either laser 84 or 86 and again go through the three branch tree with corresponding results.

A moderate electric field may be applied to increase the ratio of branch (a) to branch (b) by accelerating the excited electron in the positive $\times$ direction; this should speed up the relaxation back to the 280 meV level since the electron will not drift as far into region 58 and will have a wavefunction with a center of mass biased towards region 54. Note that a field of about 400 kV/cm would provide enough acceleration during the time that the electron is in well 56 (about 0.01 psec) to stop its motion in the negative $\times$ direction (classical approximation calculation with effective mass equal 0.067 the electron rest mass and a uniform field), but classically this would mean that the electron's kinetic energy has been dissipated and the electron has fallen into the ground subband in well 56. Also, a 400 kV/cm field is so large that disruption of the described operation is likely. Further, note that an electron entering either well 52 or well 52' will eventually emit photon(s) and drop to the lowest subband of its well and not be further excited due to the absence of a second subband with a bottom energy reachable by absorption of a photon from either laser 84 or 86.

Once an electron is excited up to the barrier potential and drifts out of well 56 to region 54, it quickly relaxes to the conduction band edge by phonon interactions (less than 0.5 psec) and accelerates along the conduction band edge to well 52; this drift through region 54 takes about 7.5 psec if we presume the electron mobility averages about 1,000 cm2/v-cm, note that the slope of the conduction band edge is 120 meV in 3,000 A (in other words a field of 4 kV/cm), and further note electrons at rest will quickly accelerate up to drift speed. Thus the packet of electrons excited out of well 56 tends to remain a diffusing packet with an exponentially decaying tail moving to well 52 and not to just continuously siphon out of well 56 into well 52. Also, the drift time of 7.5 psec is effectively a lower limit on how soon the front edge of the packet arrives at well 52 after lasers 84 and 86 are activated; thus the 7 psec duration of the pulse from lasers 84 and 86 implies that lasers 84 and 86 are off by the time that the front edge arrives in well 52. This insures that laser 84 will not be exciting the packet out of well 52 and on towards well 56". And the 8 psec pause between laser pulses insures that the tail of the pulse has time to drift into well 52. Lastly, during the drift through region 54 an electron can absorb a photon(s) from lasers 84 and 86, but will quickly relax back down to the conduction band edge as previously discussed.

An estimate on the transfer inefficiency can be made as follows: if no field is applied, then an electron excited up to the barrier potential has roughly a 50% chance of drifting into region 54 and a 50% chance of drifting back into region 58. And an electron drifting back into region 58 quickly (above-mentioned 0.5 psec) relaxes down to the conduction band edge and is accelerated back to well 56 and the 280 meV excited level; from this excited level the electron will quickly be reactivated up to the barrier potential by absorption of a laser photon, and the 50% branching repeats. Of course, a large fraction of the electrons are transferred from well 56 into region 54 during the activation of lasers 84 and 86 by this repeated branching, due to the lasers' activation for a fairly long time (7 psec) which should insure at least ten branchings and a consequent upper limit on the transfer inefficiency of 0.1%. This inefficiency can be reduced to 0.0001% by merely doubling the lase pulse durations and the drift time through the graded regions. Also, the intensity of the lasers can be increased up to the limits imposed by the heating of register 30.

During the pause between laser pulses, the drifting packet reaggregates in the lower levels of well 52: in view of the slowness of the relaxation down to the ground subband, a large fraction of the electrons will be in the first or second excited levels. Then upon activation of lasers 82 and 84 followed by the 8 psec pause, the packet transfers out of well 52 into well 56" of cell 38 analogously to the previously described transfer out of well 56. The fact that electrons start in an excited level only aids the speed and efficiency of the transfer; but us of a long pause between pulses will reaggregate the packet entirely in the ground subband and can be used analogous to a Schmitt trigger to sharpen the packet. Note that the optical phonon energies (about 33 to 36 meV in GaAs) being greater than the energy difference between the photons of lasers 82 and 86 is not significant for the operation of register 30 as long as the barriers exceed the phonon energies so as to prevent continued forward transfer when the lasers are off. Of course, the electrons representing bits of information in all of the other cells are simultaneously also moved one cell. This is the clocking of register 30.

Figure 8:
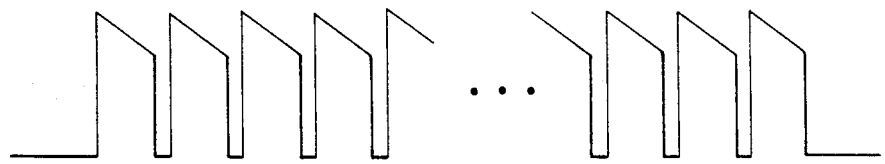
FIG. 8 illustrates the input and output for the first preferred embodiment register.

FIG. 8 schematically illustrates the input and output of register 30 by the composition profile at cells 32 and 40. These wells are connected to n-type regions for electron injection and device bias.

Register 30 may be also used as an analog delay line; indeed, the charge packets essentially neither increase nor decrease during transfer from cell to cell within the tolerance of the transfer inefficiency, and thus may represent analog data.

Figure 9A:
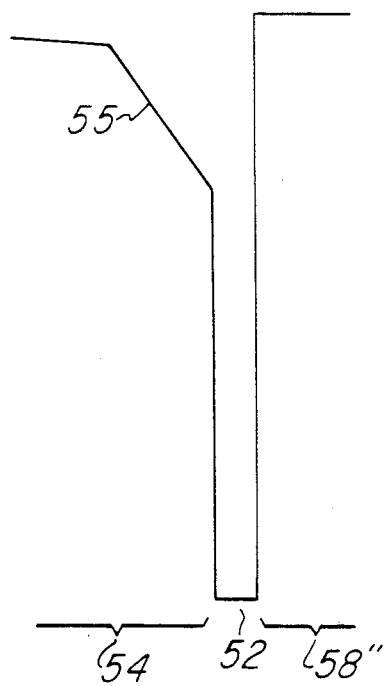
FIGS. 9A-B are composition profiles along two versions of a second preferred embodiment shift register.

FIG. 9A is a composition profile for a well plus adjacent drift regions for a second preferred embodiment shift register. The second preferred embodiment operates analogously to the first preferred embodiment shift register 30. The second preferred embodiment has steeply graded portion 55 of graded region 54 near well 52 and shallowly graded region 54 elsewhere. This grading gives rise to a steeply sloped conduction band edge in region 55 and a shallowly sloped conduction band edge elsewhere in region 54. Similarly, graded region 58 has a steeply sloped conduction band edge near well 56 and shallowly sloped band edge elsewhere. More particularly, the conduction band edge in region 55 drops 100 meV in 200 A (this provides a quasi field of 50 kV/cm) and the remainder of the edge in region 54 drops 20 meV in 1,000 A (this provides a quasi field of 2 kV/cm and an average drift speed of 2E6 cm/sec and a drift time of 5 psec if we use a mobility of 1,000 as in the previous estimates on drift time). This two-sloped band edge provides a stronger quasi field for reversing electrons coming out of wells 52 or 56 in the negative×direction and a weaker field for the drift in the positive×direction which allows regions 54 and 58 to be thinner while still providing sufficient drift time.

Figure 9B:
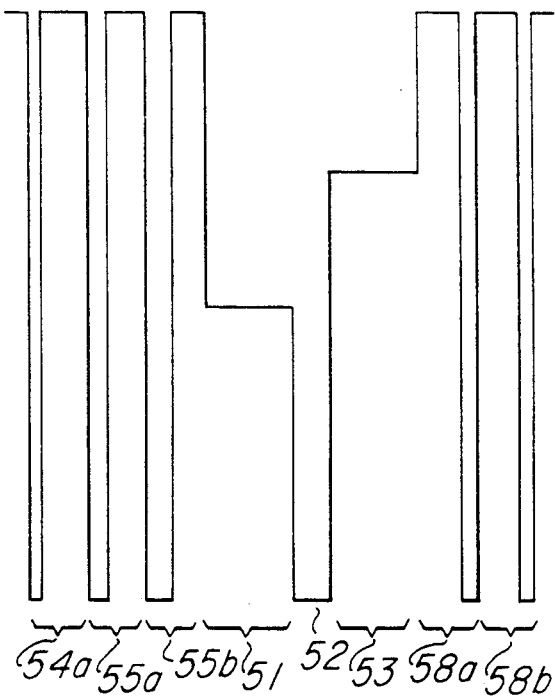

FIG. 9B is a composition profile of another version of a well and surrounding regions in the second preferred embodiment shift register; in this version the graded region 54 has been emulated by a superlattice with varying composition fraction. [Superlattice emulation can best be explained by considering a simple example: consider a superlattice with eleven periods of 100 A thickness each and with the first period consisting of 20 A of AlAs and then 80 A of GaAs, the second period 21 A of AlAs then 79 A of GaAs, the third period 22 A of AlAs then 78 A of GaAs, and so forth until the eleventh and last period with 30 A of AlAs then 70 A GaAs; this superlattice has a period-averaged composition linearly varying from Al.2Ga.8As to Al.3Ga.7As over the 1100 A and has lowest conduction band edge properties similar to (emulates) a region graded from Al.2Ga.8As to Al.3Ga.7As.] The general advantage of using an emulating superlattice in lieu of a graded region lies in the fact that the control of thickness in MBE fabrication of the superlattice layers is easier than control of the fractional composition in fabricating the graded region. In FIG. 9B the superlattice has components GaAs and Al.4Ga.6As and the GaAs is oriented in each period to be away from well 52 for clarity. Also, the steeply sloped band edge 55 portion of region 54 is emulated by two periods, 55a and 55b, the remainder of region 54 by period 54a plus others not shown, and region 58" by periods 58a and 58b and others not shown. Further, buffer layers 51 and 53 lie between well 52 and the superlattices; buffer layer 51 is Al.2Ga.8As and 150 A thick and buffer layer 53 is Al.29Ga.71As and 150 A thick. Buffer layers 51 and 53 help preserve the depth of well 52; without buffers well 52 would just be another part of the superlattices and well 52 would be averaged into a shallower, rounded potential well. Of course, fluctuations in the grading (bumps and dips in the conduction band edge) will not disrupt the drift of the packet on the average unless the bumps present insurmountable barriers or the dips inextricable traps; further, the continual excitation and relaxation of the drifting electrons during the lasers' pulse will help overcome bumps and dips.

Figure 10:
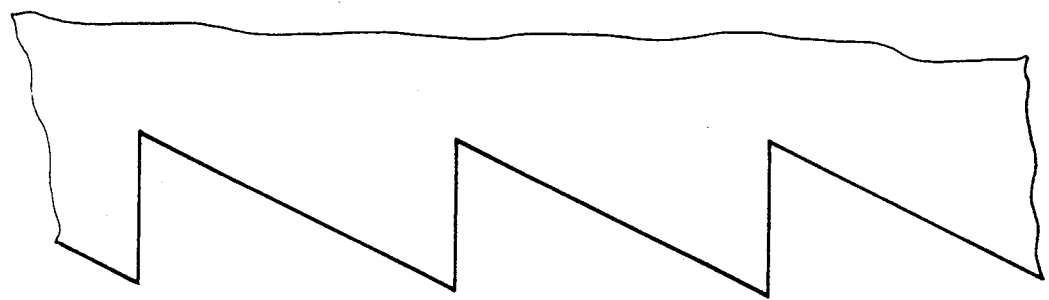
FIG. 10 illustrates the conduction band along a third preferred embodiment shift register.

A third preferred embodiment shift register operates in a manner similar to first preferred embodiment shift register 30 but does not have wells 52, 56, 52', 56', etc. and has only one laser. Rather, the third preferred embodiment relies entirely on the pause between laser pulses for preservation of the electron packets by aggregation at the low points in the sawtooth-shaped conduction band edge. FIG. 10 is a conduction band diagram for the third preferred embodiment; and the discussion of register 30 applies except for the need for excitation out of and the possibility of relaxation down into a deep well. Note that the conduction band shape allows for regions (the triangular low point of each sawtooth period) where electrons will collect due to the quasi fields. The clocking laser has a photon energy selected to excite an electron in the lowest subband in a triangular well to near the top of the barrier, and no selective intermediate levels analogous the 196 meV and 229 meV levels of register 30 exist; thus the laser is analogous to laser 84 and there are no analogs of lasers 82 and 86. The third preferred embodiment is easier to fabricate than the other preferred embodiments, but may not be the most efficient. Note that inclusion of the deep wells 52, 56, 52', etc. in register 30 likely enhances the efficiency of electron collection for the the small fraction of electrons that do not thermalize (relax) to the conduction band edge or are re-excited to higher states in the conduction band. Also, the third preferred embodiment could be fabricated from a superlattice emulating the sawtooth composition profile, and the triangular wells formed by the sawtooth have closely spaced energy levels so widely-spaced discete levels and selective excitation are not available.

Figure 11:
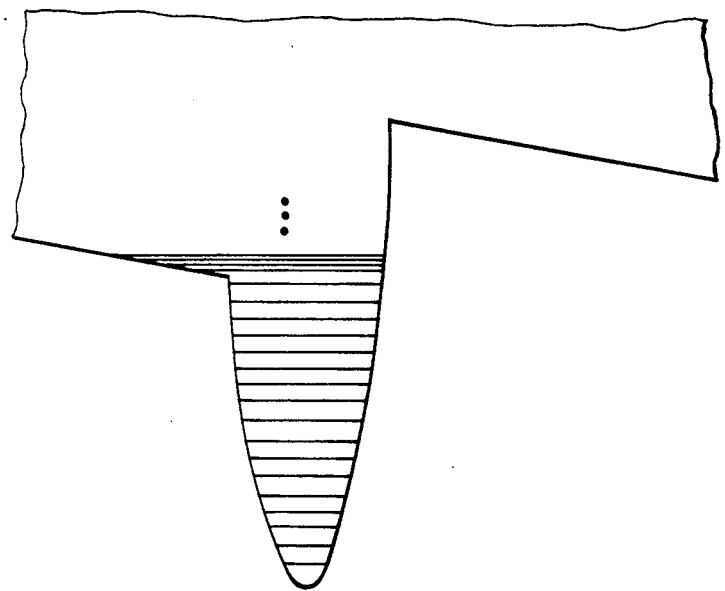
FIG. 11 illustrates the conduction band along a fourth preferred embodiment shift register.

A fourth preferred embodiment shift register operates in a manner similar to first preferred embodiment shift register 30 except that wells 52 and 56 are large parabolic so that an equispaced series of energy levels is available for fast relaxation down into the wells; see FIG. 11. As with register 30, the levels are adjusted so that only the appropriate laser can excite electrons out of the ground level. Of course, the equispaced levels must be far enough apart so that electrons cannot easily be phononically excited up the levels. The fourth preferred embodiment utilizes the fast relaxation to the well ground levels for preservation of electron packets.

Figure 12:
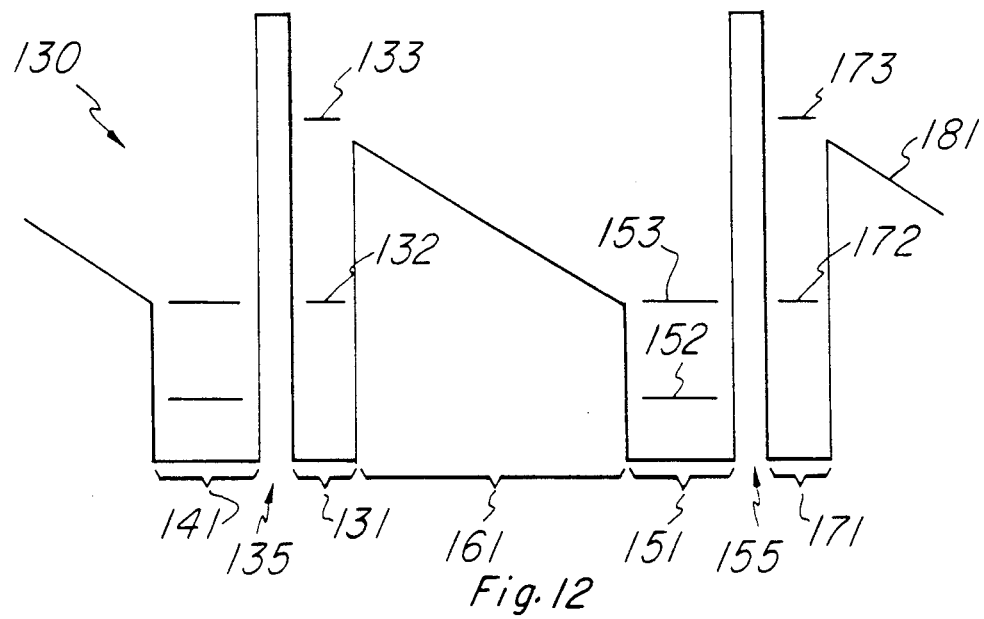
FIG. 12 illustrates the conduction band along a fifth preferred embodiment shift register.

A fifth preferred embodiment shift register, generally denoted 130, is shown in a schematic conduction band edge diagram in FIG. 12. In this embodiment, the clocking process is as follows:

(1) Electrons in well 131 are excited from the ground state 132 to the excited state 133 by a laser tuned to the energy difference between these states; let us denote the wavelength as L1. Note that the excitation rate to this excited state is in the 2 picosecond region as estimated in the previous discussion. Upon reaching the excited state, the electron can (i) re-radiate back to the ground state; this time is on the order of 1 nanosecond as noted in the previous discussion; (ii) drift to the left, through barrier 135, into well 141 (this rate is determined by the position of level 133 and trimmed by the width of barrier 135; for a 20 Å barrier, only 0.2% of the electrons penetrate the barrier); (iii) travel to the right toward well 151.

(2) The electrons are accelerated toward well 151 by graded AlGaAs region 161, or alternatively, a period-modulated superlattice that emulates the band edge of graded AlGaAs region 161. The relaxation time to the band edge is of order 0.5 psec, so that re-entry into well 131 is unlikely.

(3) Light of wavelength L1 has been shut off by the time the electrons reach well 151. If region 161 between well 131 and well 151 is not sufficiently long to allow this, the insertion of a number of tunneling barriers in the path will sufficiently slow down the transfer without any degredation to satisfy this condition. When the electrons reach well 151 at energy level 153, they can:

(a) relax to ground state 152 of well 151. This state has a small but finite probability of existing in well 171; or (b) tunnel through barrier 155 to level 172 in well 171; in this case, the electrons will resonate between the "doublet" of levels 153 and 172 and will eventually relax to the ground state of well 151. Note that the purpose of tunneling barrier 155 is to seperate well 151 from well 171 thus defining the energy levels, and to stop the "backwards" clocking as pointed out above.

(4) The electrons will stay in the ground state of well 151 until application of light wavelength L2, in which they then occupy the excited state 153. Upon application of light of wavelength L1, the electrons then tunneling to level 172 of well 171 are then excited to level 173 and relax to the band edge 181 and continue to the next well (not shown).

In this mode the register is a single clocked (i.e., wavelength L1 and L2) device. We can easily make it a dual clocked device by making alternating sets of wells tuned to a different frequency, say wavelength L3 plus wavelength L1.

Figure 13:
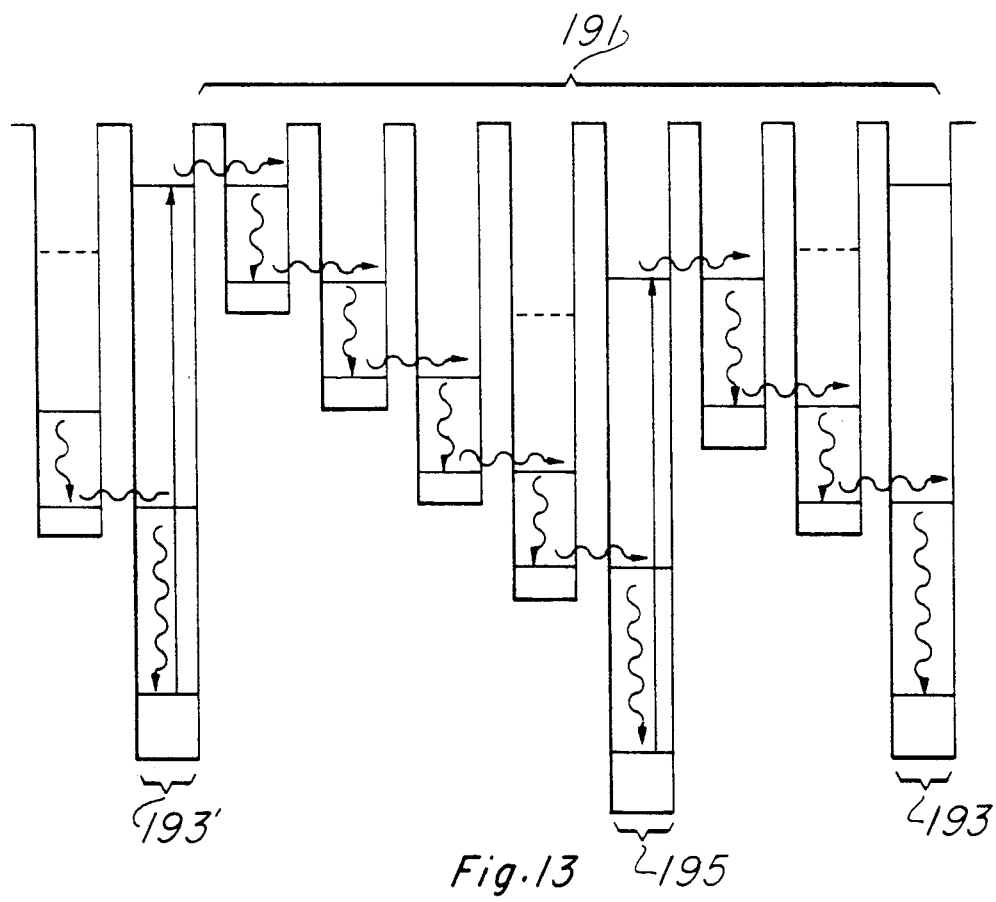
FIG. 13 illustrates the conduction band along a sixth preferred embodiment shift register.

A sixth preferred embodiment is analogous to the other preferred embodiments but relies on resonant tunneling for transport and is thus able to fully use the discrete energy levels of deep wells to eliminate the possibility of excited electrons going in the negative X-direction. FIG. 13 is a conduction band edge diagram along the sixth preferred embodiment register with the discrete levels in the wells indicated; note that the staggering of the bottoms of the wells yields a directional electron flow much like that induced by the quasi field of the graded region. Note that this staggering of the bottoms of the wells may be fabricated by layers of constant composition and without any grading. In FIG. 13 the operation of the sixth preferred embodiment is suggested by the horizontal wavy arrows indicating tunneling, vertical wavy down arrows indicating relaxation, and the two straight vertical up arrows indicating optical excitation at two different frequencies (which are drawn to differ by about ten percent in FIG. 13). The dotted lines illustrate where some of the available energy levels are as an aid in seeing the unavailability of negative X direction tunneling. Also note that the relaxation transitions (wavy arrows down) are relatively low energy compared to the excitation transitions (straight up arrows); this allows for adjustment of energy levels (by adjustment of dimensions and materials) t realize phononic relaxation but avoid phononic excitation. Consequently, the relaxation transitions may be very fast and, combined with the lack of negative X direction tunneling, yield a very fast device. Bracket 191 in FIG. 13 indicates one cell; that is, the analog of cell 36 of FIG. 3. Note that electrons which are excited up in well 193' by the first frequency photons and which tunnel and relax down to well 195 are not excited up in well 195 by the first frequency photons and thus aggregate in well 195; no pause in the optical excitation is required. Once a packet of electrons transfers from well 193' to well 195, the first frequency excitation may be terminated and the second frequency excitation may immediately begin to transfer the packet from well 195 to well 193.

Figure 14:
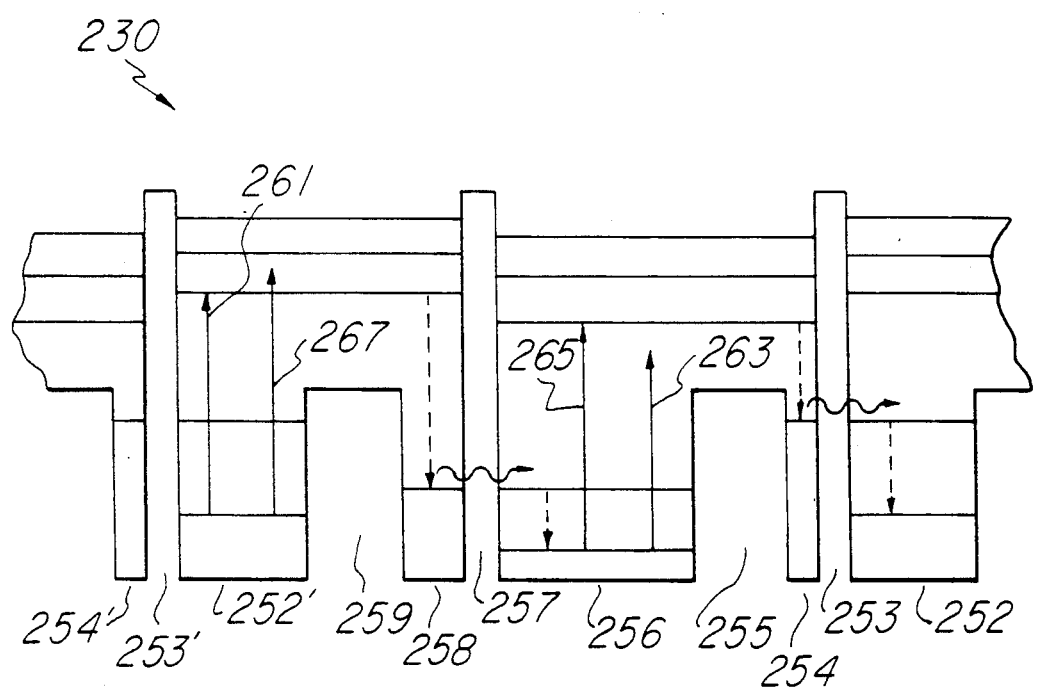
FIG. 14 illustrates the conduction band along a seventh preferred embodiment shift register.

FIG. 14 illustrates the conduction band for seventh preferred embodiment register 230 which employs tunneling for transfer between wells as in the sixth preferred embodiment. Register 230 is somewhat analogous to register 30, and the "analogous" regions of register 230 have been given analogous reference numerals in FIG. 14. Register 230 operates as follows. Electrons in the lowest level of well 252' are excited by a first laser (or other fairly monochromatic light source) up to the lowest level common to both wells 252' and 258; this is suggested by arrow 261 in FIG. 14. Note that for region 259 of dimensions comparable to those of wells 252' and 258, the levels common to both wells are still fairly widely spaced (this differs from register 30 as illustrated in FIG. 5). The excited electrons relax down into either well 252' or well 258, and those which fall back into well 252' are rapidly re-excited by the first laser. Also, electrons excited up in well 252' cannot tunnel through barrier 253' (or 257) into well 254' (or 256) because there are no levels in well 254' (or 256) in energy resonance with the lowest level common to wells 252' and 258. Electrons relaxing down into well 258 tunnel through barrier 257 and then relax to the lowest level of well 256. Note that this relaxation prevents electrons that have tunneled into well 256 from tunneling back into well 258 and imparts directionality "analogous" to the graded region 58 of register 30. Electrons in the lowest level of well 256 are not excited by the first laser because no optically resonant levels are available for absorption at this frequency as suggested by arrow 263; thus the electrons excited up in well 252' eventually end up in the lowest level of well 256. The electrons in well 256 are then transferred to well 252 by excitation by a second laser to a common level (see arrow 265 in FIG. 14), relax into well 254, tunnel through barrier 253, and finally relax to the lowest level of well 252. The second laser does not excite electrons up in well 252 because its photon energy would excite electrons to energies which have no corresponding levels; see suggestive arrows 267 and 267' in FIG. 14. Thus the electrons have been transferred from well 252' to well 252; this transfer can then be repeated and regions 252', 259, 258, 257, 256, 255, 254, and 253 form one cell of register 230.

The preferred embodiments and variations (such as just one or two cells) can be adapted to operation as devices other than shift registers. For example, even if the output of a preferred embodiment device were at a higher potential than the input, the device could still transfer carriers from the input to the output provided that the difference in potential (which induces an electric field across the device that accelerates the carriers in the negative X direction) is insufficient to overcome the quasi fields of the graded or analogous regions of the device. In other words, the device can operate as a charge pump. Similarly, the device can operate as a photodiode, especially in view of the fact that pulsed excitation is not necessary and the spreading of carrier packets into a continuous stream is permissible.

MODIFICATION AND ADVANTAGES

The dimensions and materials of the preferred embodiment shift registers can be greatly varied while still preserving the mode of operation. Indeed, the aluminum gallium arsenide system could be replaced with other systems such as indium arsenide phosphide, mercury cadmium telluride, etc. and still maintain single crystal structures; but further, the devices could fabricated from thin layers of glasses, insulators, metals, etc. and still provide the quantum well structure and operation as in the preferred embodiments. Holes instead of electrons could be the carrier, or even both holes and electrons clocking in opposite directions simultaneously. The energy levels could be changed by either dimensional changes or material changes or combinations. For example, the wells could be triangular, as an extreme case of the steeply sloped band edge of the second preferred embodiment. Indeed, any composition profile yielding a band edge which is a series of cells with each cell having at least one depression, possibly discontinuous, in the band edge (a potential "well") and having a negative (positive) slope for the majority or all of the band edge plus a positive (negative) slope for a minority or none of the band edge may operate in a manner analogous to the third preferred embodiment and possibly others provided that the barrier heights, drift times, optical source pause times, etc. are consistent. Note that each cell could look radically different from the others yet still provide the same performance; and all or portions of each cell's band edge may be emulated by various superlattices. Similarly, the tunneling barriers and potential wells of the fifth, sixth, and seventh preferred embodiments can be replaced with a band edge of general shape provided that the appropriate levels on each side of a tunneling barrier line up for resonance. Furthermore, the temperature of operation may be adjusted, and this has the effect of expanding or contracting the phonon population and thus the speed of transitions between closely spaced levels.

The ratio of the speed of the relaxation down from the excited levels to the ground levels in the wells to the speed of excitation out of the wells could be adjusted so that either the drift and aggregation or the relaxation to the ground level is the dominant method of preserving an electron packet.

The graded regions 54, 58, 54', etc. can be replaced by various different emulating superlattices by changing the superlattice period (even a varying "period") and component materials (for example, AlAs and GaAs could be replaced by Al.5Ga.5As and Al.1Ga.9As in the second preferred embodiment example provided an adjustment to the fraction of each period occupied by each component is made). Also, strained layer superlattices, modulation doped superlattices and tunable superlattices could be used and provide further controllable parameters in the clocking operation; for example, a tunable modulation-doped superlattice with graded doping to produce an approximate saw tooth conduction and/or valence band edge can then be driven by a combination of optical excitation and electrical bias to semi collapse the potential wells.

And the optical excitation may be by incoherent light as well as by laser light for the embodiments that do not require narrow band light, and may be by narrow band, monochromatic incoherent light for the embodiments that do require narrow band light.

The preferred embodiments and modifications permit fabrication of extremely small devices with high transfer speeds and high density.

We claim:
1. A charge pump comprising:
 a) a region of semiconductor material having an input terminal and an output terminal, said output terminal spaced from said input terminal;
 b) said region including compositionally graded semiconductor material between said input and output terminals having an energy band edge of said graded semiconductor material decreasing from said input terminal to said output terminal; and
 c) a light source illuminating said region whereby said light source provides energy to excite charge carriers to an energy level near or above the highest portion of said band edge to create an omnidirectional carrier flow toward said output terminal.

2. The charge pump of claim 1 wherein said light source is pulsed and said charge carriers are transferred in packets.

3. The charge pump of claim 1 wherein said energy band edge is the lowest conductor band edge.

4. The charge pump of claim 1 wherein said energy band edge is essentially monotonically decreasing except for discontinuities.

* * * * *